United States Patent
Ding et al.

(10) Patent No.: US 7,956,695 B1
(45) Date of Patent: Jun. 7, 2011

(54) HIGH-FREQUENCY LOW-GAIN RING VCO FOR CLOCK-DATA RECOVERY IN HIGH-SPEED SERIAL INTERFACE OF A PROGRAMMABLE LOGIC DEVICE

(75) Inventors: Weiqi Ding, Fremont, CA (US); Mengchi Liu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/729,356

(22) Filed: Mar. 23, 2010

Related U.S. Application Data

(62) Division of application No. 11/761,654, filed on Jun. 12, 2007, now abandoned.

(51) Int. Cl.
H03B 5/12 (2006.01)

(52) U.S. Cl. ........... 331/17; 331/177 V; 331/179; 331/8; 331/1 R

(58) Field of Classification Search ............ 331/57, 331/107 R, 177 R, 157
See application file for complete search history.

(56) References Cited

U.S. PATENT DOCUMENTS

| | | | | |
|---|---|---|---|---|
| 5,300,898 | A * | 4/1994 | Chen et al. | 331/57 |
| 5,477,198 | A | 12/1995 | Anderson et al. | |
| 5,559,473 | A * | 9/1996 | Anderson et al. | 331/34 |
| 6,650,196 | B2 * | 11/2003 | Nguyen | 331/179 |
| 6,771,105 | B2 * | 8/2004 | Andrasic et al. | 327/276 |
| 7,019,570 | B2 * | 3/2006 | Starr | 327/156 |
| 7,126,432 | B2 | 10/2006 | Roubadia et al. | |
| 7,129,792 | B2 * | 10/2006 | Gomez | 331/16 |
| 7,263,152 | B2 * | 8/2007 | Miller et al. | 375/371 |
| 7,288,997 | B2 * | 10/2007 | Chen | 331/16 |
| 7,382,203 | B2 * | 6/2008 | Kang | 331/57 |
| 7,471,160 | B2 * | 12/2008 | Feng et al. | 331/17 |
| 7,541,854 | B2 * | 6/2009 | Lee | 327/266 |

OTHER PUBLICATIONS

Maxim, A., et al., "9.953-12.5GHz 0.13μm CMOS LC VCO Using a High Resolution Calibration and a Constant Gain Varactor," *IEEE 2005 Custom Integrated Circuits Conference* (Sep. 18-21, 2005), pp. 545-548.

* cited by examiner

*Primary Examiner* — James H. Cho
*Assistant Examiner* — Christopher Lo
(74) *Attorney, Agent, or Firm* — Ropes & Gray LLP; Jeffrey H. Ingerman

(57) ABSTRACT

A voltage-controlled oscillator operates at high frequency without high gain by dividing the frequency range into a plurality of subranges, which preferably are substantially equal in size. Within any subrange, the full extent of variation in the control signal changes the frequency only by the extent of the subrange. The gain is thus substantially equal to the gain one would expect for the full frequency range, divided by the number of subranges. The subrange may be selected manually, or by an initial calibration process. In one embodiment, the oscillator includes a voltage-to-current converter and a current-controlled oscillator, with a current mirror arrangement. In that embodiment, selection of the subrange may be controlled by turning on the correct number of current legs.

10 Claims, 6 Drawing Sheets

HIGH-FREQUENCY LOW-GAIN RING VCO FOR CLOCK-DATA RECOVERY IN HIGH-SPEED SERIAL INTERFACE OF A PROGRAMMABLE LOGIC DEVICE

CROSS REFERENCE TO RELATED APPLICATION

This is a division of copending, commonly-assigned U.S. patent application Ser. No. 11/761,654, filed Jun. 12, 2007, which is hereby incorporated by reference herein in its entirety.

BACKGROUND OF THE INVENTION

This invention relates to a voltage-controlled oscillator (VCO) used as a frequency standard in clock-data recovery circuitry of a high-speed serial interface, especially in a programmable logic device (PLD).

It has become common for PLDs to incorporate high-speed serial interfaces to accommodate high-speed (i.e., greater than 1 Gbps) serial input/output (I/O) standards. Many of these standards can operate at more than one clock rate. However, it is a common feature of most if not all high-speed serial data protocols that neither the clock nor information about the clock is sent with the data. Instead, the clock must be recovered from the data.

For this purpose, it is known to use "clock-data recovery" techniques in high-speed serial interfaces. Such techniques recover the clock from serial data using a closed-loop feedback system including, e.g., a phase-locked loop or delay-locked loop. Such loop circuits frequently includes VCOs, such as ring VCOs.

With high-speed serial interfaces approaching data rates of 10 Gbps, 6 GHz ring VCOs are becoming common to supply clocks for the CDR circuitry of such interfaces. In known VCOs, the gain of the VCO ($K_{VCO}$) is directly proportional to the frequency—i.e., the gain increases as the frequency increases. However, VCO gain also determines the sensitivity of the output clock phase to any disturbance (or noise) on the input control voltage. As VCO gain increases to accommodate increased frequency and higher data rates, so does VCO output clock jitter due to ripples in the control voltage.

For example, VCO gain may be about 30 GHz/V at a 6 GHz oscillation frequency. This means that a 0.2 mV change in the control voltage will cause a 6 MHz frequency shift in the output. Such VCO jitter may eventually limit the input jitter tolerance of the receiver, and may even cause the CDR process to fail. This may be of particular concern in PLDs, where each particular user configuration, and therefore sensitivity to jitter, may differ.

Accordingly, it would be desirable to be able to provide a VCO with high oscillation frequency but low gain.

SUMMARY OF THE INVENTION

In accordance with the present invention, the oscillator range preferably is broken into a plurality of frequency subranges. Within each subrange, the full range of the input control signal preferably causes the output to span only the subrange. Therefore, the frequency change per unit of input control signal—i.e., the gain—preferably is relatively low. To generate a particular oscillator output frequency, the correct frequency subrange preferably is selected first, and then the loop circuit feedback operates substantially conventionally to fine-tune the output signal within the subrange.

The "coarse tuning" of the frequency subrange may be achieved manually—i.e., by user input—or more preferably by an initial power-up calibration sequence.

In a preferred embodiment, the oscillator is a current-controlled oscillator (ICO) rather than a voltage-controlled oscillator. In part, this is because it is easier to map control currents than control voltages to create the coarse tuning frequency subranges. For example, a current mirror structure, as described in more detail below, may be used. The user may select the number of current legs that are turned on to coarse-tune the frequency, or the correct number of current legs may preferably be turned on using an automatic calibration sequence.

For example, according to one preferred calibration embodiment, the oscillator starts up in a predetermined default frequency range—e.g., the center range out of all possible ranges—by virtue of a number of current legs being turned on. Each location in a shift register preferably corresponds to a particular current leg, and the shift register preferably is preloaded with 0's and 1's in appropriate locations to turn on appropriate current legs to select the default frequency range. The control voltage derived from the operation of the loop circuit on the output frequency is compared to upper and lower thresholds. If the control voltage rises above the upper threshold or falls below the lower threshold, the values in the shift register are shifted in the corresponding direction to turn off a current leg or to turn on an additional current leg, as appropriate, changing the frequency subrange. The process continues until the control voltage remains between the upper and lower thresholds.

Once the frequency subrange has been set, whether manually or automatically, the oscillator, which preferably is a ring oscillator, operates normally but at a low gain sufficient to allow the control voltage range between the upper and lower thresholds to span the frequency subrange. For any complete frequency range with gain $K_{VCO}$, if there are N subranges, the gain required in the oscillator preferably is only $K_{VCO}/N$. In order to assure full coverage of the frequency range, the subranges may be made to overlap slightly. In that case, the gain of the oscillator may be slightly larger than $K_{VCO}/N$.

Thus, in accordance with the present invention there is provided an oscillator for use with a loop circuit. The oscillator provides an output signal in a range of frequencies in response to an input signal, with the range of frequencies being divided into a plurality of subranges. The oscillator includes a coarse tuning stage that selects one of the subranges, and a core oscillator stage that, in response to varying of the input signal over an input range, causes the output signal to vary across that one of the subranges. As a result, gain of the oscillator over the frequency range is substantially equal to gain of the core oscillator stage over that one of said subranges.

A serial interface incorporating the oscillator, and a programmable logic device incorporating that serial interface, also are provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, in the present invention the oscillator range preferably is broken into a plurality of frequency subranges. Within each subrange, the full range of the input control signal preferably covers only the subrange. Therefore, the frequency change per unit of input control signal—i.e., the gain—preferably is relatively low. To generate a particular oscillator output frequency, the correct frequency subrange preferably is selected first, and then the loop circuit feedback operates substantially conventionally to fine-tune the output signal. The "coarse tuning" of the frequency subrange may be achieved manually—i.e., by user input—or more preferably by an initial power-up calibration sequence.

In a preferred embodiment, the oscillator is a current-controlled oscillator (ICO) rather than a voltage-controlled oscillator, as described above. Preferably, a current mirror structure, as described in more detail below, is used to select, or "coarse tune," the frequency subrange, by turning on the correct number of current legs, either manually or automatically as described above. The oscillator itself preferably is a ring oscillator, and particularly preferably is a two-stage oscillator.

For any complete frequency range with gain $K_{VCO}$, if there are N subranges, the gain required in the oscillator is only $K_{VCO}/N$. In order to assure full coverage of the frequency range, the subranges may be made to overlap slightly. In that case, the gain of the oscillator may be slightly larger than $K_{VCO}/N$.

The invention will now be described with reference to FIGS. 1-7.

Figure 1:
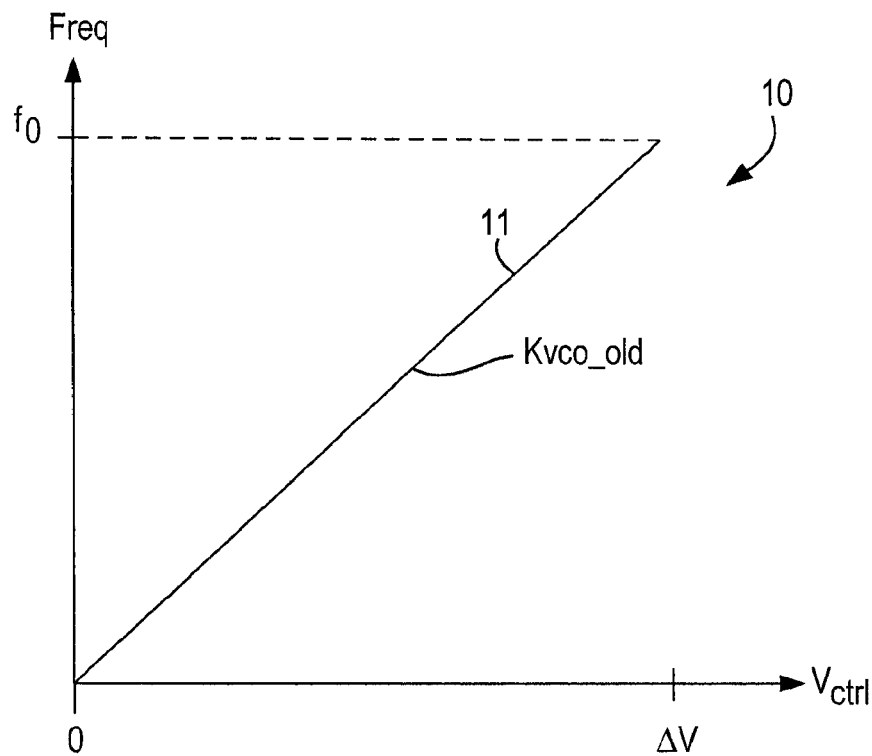
FIG. 1 is a plot of frequency as a function of control voltage for a conventional VCO.

FIG. 1 is a plot 10 of frequency as a function of control voltage for a conventional VCO, which may be a ring oscillator or any other type of VCO. In this example, for a control voltage range $\Delta V$, the output frequency ranges from 0 to $f_0$. The gain, identified as $K_{VCO\_old}$, is the slope of the output 11—i.e., $K_{VCO\_old} = f_0/\Delta V$.

Figure 2:
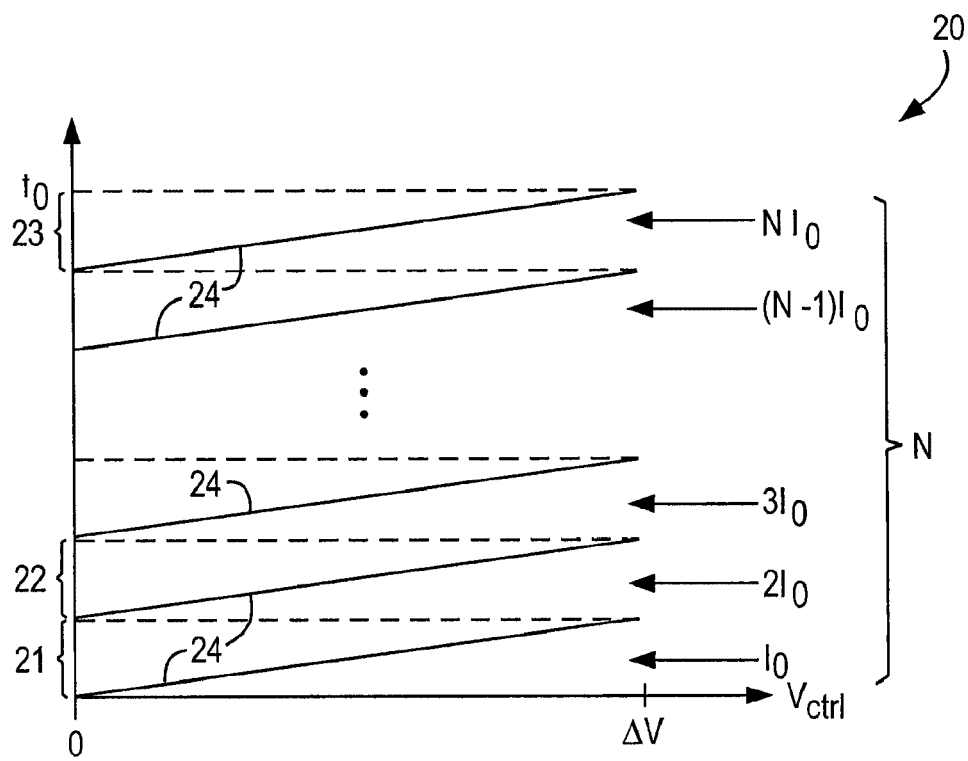
FIG. 2 is an idealized plot of frequency as a function of control voltage for a preferred embodiment of a VCO in accordance with the present invention.

In comparison, FIG. 2 is an idealized plot 20 of frequency as a function of control voltage for a preferred embodiment of a VCO in accordance with the present invention. In idealized plot 20, the frequency range 0 through $f_0$ is broken down into N equal frequency subranges. Thus, the first subrange 21 ideally spans the frequency range 0 through $f_0/N$, the second subrange 22 ideally spans the frequency range $f_0/N$ through $2f_0/N$, and so on through the Nth subrange 23 which ideally spans the frequency range $(N-1)f_0/N$ through $f_0$. In practice, in order to assure that there are no gaps in the coverage of the frequency range 0 through $f_0$, each subrange may be made slightly larger than $f_0/N$, so that the subranges overlap (not shown). Thus, the first subrange might span the frequency range 0 through $(f_0/N)+\delta$, the second subrange 22 might span the frequency range $(f_0/N)-\delta$ through $(2f_0/N)+\delta$, and so on through the Nth subrange 23 which might span the frequency range $((N-1)f_0/N)-\delta$ through $f_0$.

As can be seen in ideal plot 20, for a control voltage range of $0-\Delta V$, the gain, identified as $K_{VCO\_new}$, within each subrange is again the slope of the output 24—but in this case, $K_{VCO\_new} = (f_0/N)/\Delta V = (f_0/\Delta V)/N = K_{VCO\_old}/N$. In the non-ideal case, the gain, $K_{VCO\_actual}$, in first and last subranges 21, 23 would be equal to $((f_0/N)+\delta)/\Delta V = K_{VCO\_new}+(\delta/\Delta V)$, while in the intermediate subranges such as subrange 22, the gain, $K_{VCO\_actual}$, would be equal to $((f_0/N)+2\delta)/\Delta V = K_{VCO\_new}+(2\delta/\Delta V)$. Insofar as $\delta$ would be expected to be very small (e.g., at most about 5% of $f_0/N$), $K_{VCO\_new}$ would be a good approximation of $K_{VCO\_actual}$ even in the non-ideal case. In a preferred embodiment, the frequency range is broken into five or six frequency subranges. Thus, if the gain of a known oscillator at 6 GHz is 30 GHz/V as above, the gain in this embodiment of an oscillator according to the present invention would be only 5 GHz/V or 6 GHz/V. In such a case, a 0.2 mV change in the control voltage will cause a frequency shift in the output of between 1 MHz and 1.2 MHz, rather than 6 MHz as above.

Figure 3:
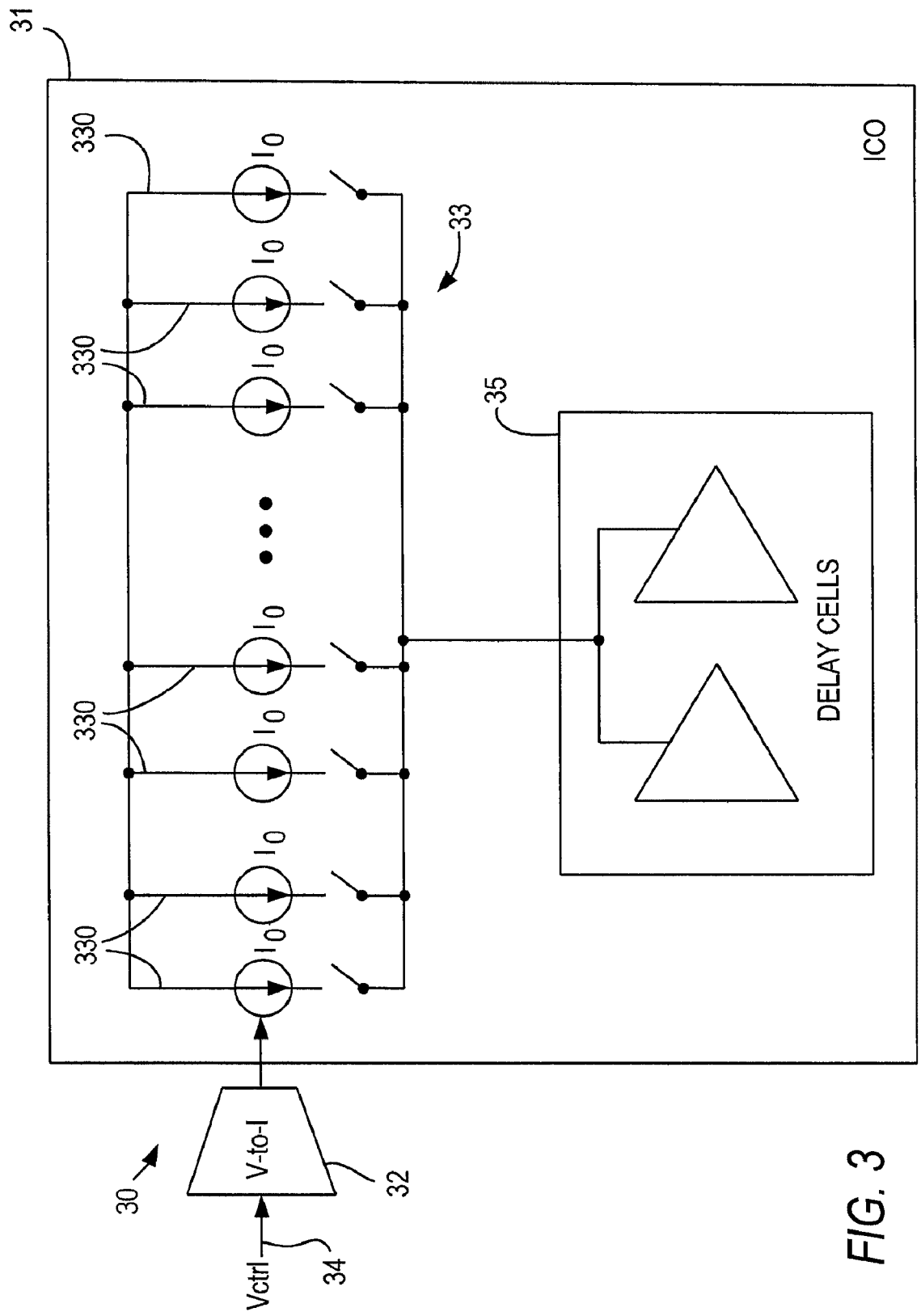
FIG. 3 is a schematic representation of one preferred embodiment of a VCO structure for implementing the present invention.

A preferred VCO structure 30 for implementing the present invention is shown schematically in FIG. 3. VCO 30 preferably includes a voltage-to-current converter 32, controlling a current-controlled-oscillator (ICO) 31, which preferably is used as the core oscillator instead of a VCO. First, an ICO has a smaller control voltage range because of charge pump output swing limitation. This will further limit output variations based on input voltage changes. Second, use of an ICO allows more easily the creation of the frequency subranges as described below.

Current mirror structure 33 allows each frequency subrange to be selected, in a form of coarse tuning, by turning on a desired number of fixed current legs 330. Within that subrange, the input control current, as converted from the control voltage 34, controls core ICO 35 within the one selected frequency subrange.

Figure 4:
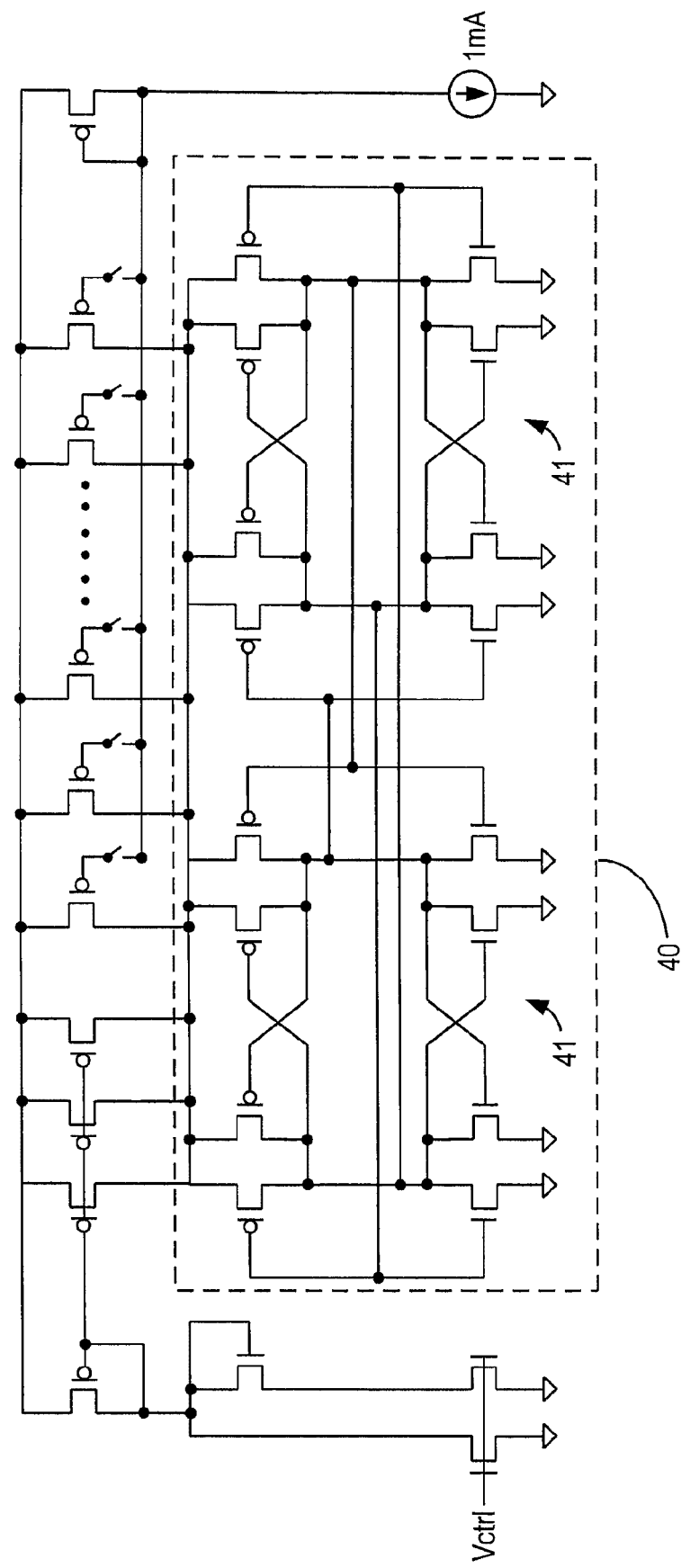
FIG. 4 is a schematic representation including one preferred embodiment of a two-stage ring oscillator for use in the VCO structure of FIG. 3.

Core ICO 35 preferably is a two-stage ring oscillator 40, as shown in more detail in FIG. 4, because two-stage ring oscillators offer the highest oscillating frequency at the lowest phase noise. However, because two inverters may not have enough phase shift to ensure a stable oscillation, additional phase shift can be provided by local positive feedback loops using cross-coupled latch stages 41. Alternatively, the phase shift can be provided by inductive peaking (using either a real inductor or an actively-simulated inductor) (not shown).

Figure 5:
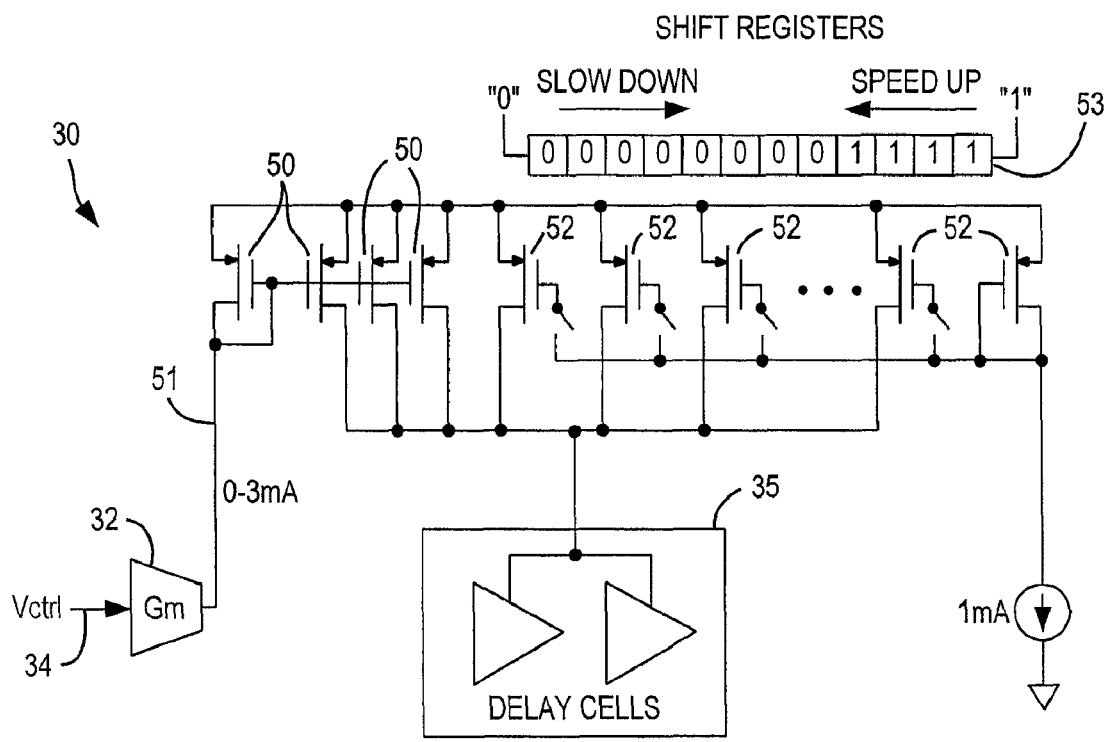
FIG. 5 is a more detailed representation of the VCO structure of FIG. 3.

VCO 30, and particularly current mirror structure 33, are shown in more detail in FIG. 5. Legs 330 of current mirror structure 33 include a first plurality of transistors 50 that are always connected and controlled by current 51, derived from input control voltage 34 by voltage-to-current converter 32. Legs 330 also preferably include a second plurality of transistors 52 each of which is turned off or on by the presence of a "0" or "1" in a respective corresponding bit position in shift register 53. The more of legs 52 that are turned on, the higher the oscillator frequency.

The "thermometer coding" provided by current mirror structure 33 maintains monotonic changes and avoids large current spikes, preferably avoiding the need to have overlapping frequency subranges of the type described above. This structure also is relatively insensitive to process and temperature variations. And because the current legs are substantially fixed, isolation of the VCO from the charge pump of the loop circuit is provided. Moreover, the entire structure can be provided in a single deep-N well, avoiding the need for native devices, which would be required as a source follower in a VCO.

Figure 6:
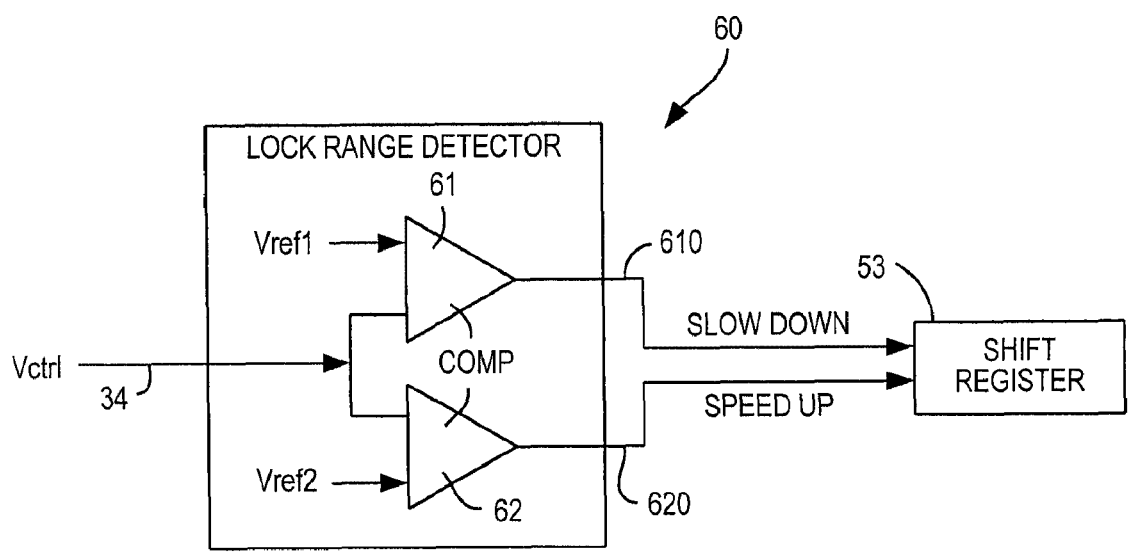
FIG. 6 shows one preferred embodiment of a calibration circuit that may be used for a power-up calibration mechanism in accordance with the invention.

Although the required number of legs 52 can be turned on manually—i.e., by user input, preferably the automatic power-up calibration mechanism described above is provided. FIG. 6 shows a calibration circuit 60 that may be used for the power-up calibration mechanism. Shift register 53 preferably is initially loaded with a pattern of 0's and 1's that provides coarse tuning of a frequency near the middle of the range of possible frequencies—e.g., a pattern that turns on half of legs 52. Control voltage $V_{ctrl}$ 34 preferably is compared by comparators 61, 62 to an upper reference voltage $V_{ref1}$ and a lower reference voltage $V_{ref2}$. If $V_{ctrl}$ 34 is between upper reference voltage $V_{ref1}$ and a lower reference voltage $V_{ref2}$, then no change in the coarse tuning and ring oscillator 40 operates in accordance with $V_{ctrl}$ 32. If $V_{ctrl}$ 34 is not between upper reference voltage $V_{ref1}$ and a lower reference voltage $V_{ref2}$, then an appropriate "down" or "up" signal 610, 620 shifts the pattern of 0's and 1's in shift register 53 in the correct direction to raise or lower the frequency until $V_{ctrl}$ 34 is between upper reference voltage $V_{ref1}$ and a lower reference voltage $V_{ref2}$, and then ring oscillator 40 operates in accordance with $V_{ctrl}$ 34.

Figure 7:
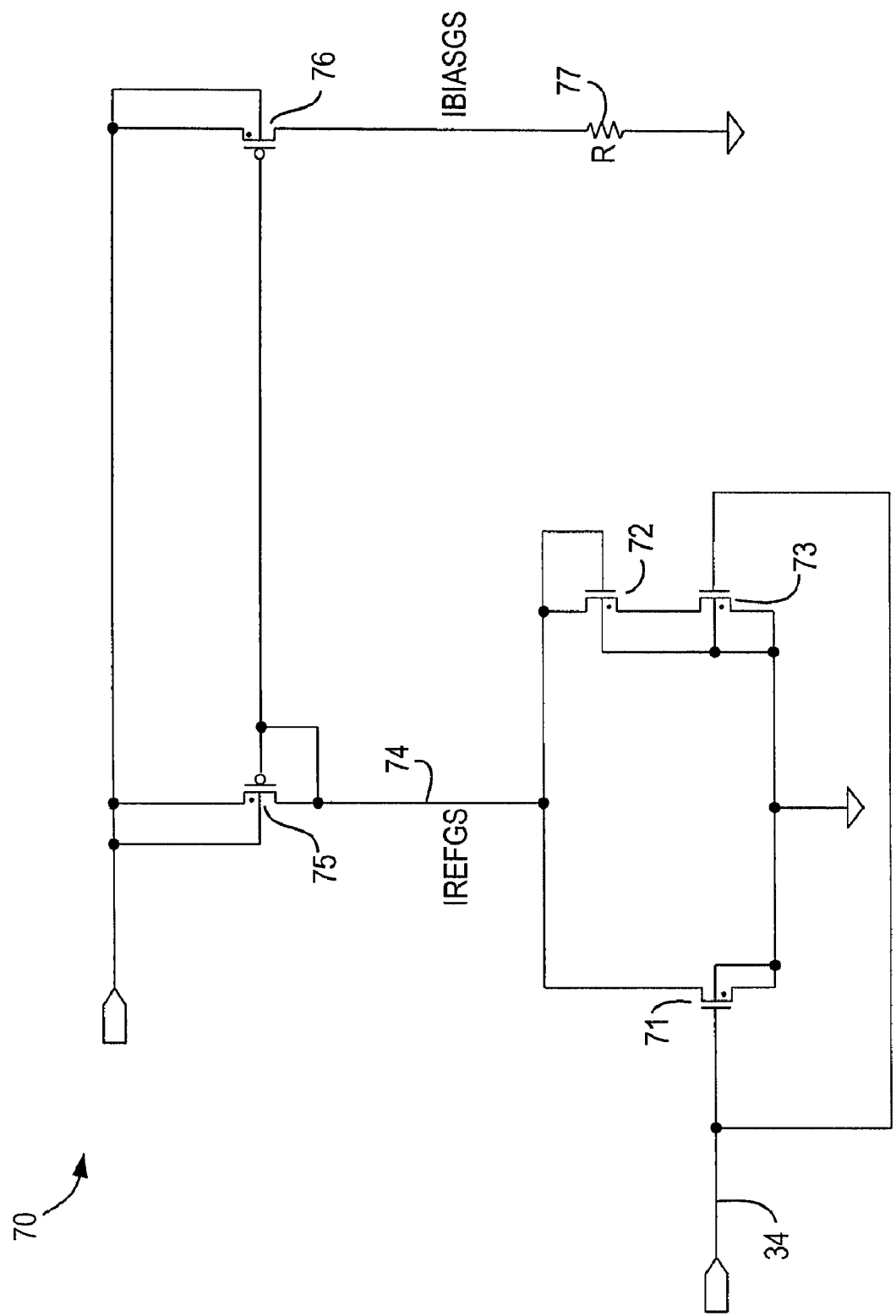
FIG. 7 is a schematic representation of one embodiment of a voltage-to-current converter that may be used in accordance with the present invention.

One embodiment of a voltage-to-current converter that may be used as voltage-to-current converter 32 in accordance with the present invention is shown in FIG. 7. Converter circuit 70 preferably provides a V-to-I curve that is as linear as possible, to preserve as much as possible of the tuning range given the limited charge pump output voltage (see above). Normally, a transistor's V-I curve has intrinsic nonlinearity and is either concave or convex. However, in accordance with a preferred embodiment, two transistors may be biased at the same gate voltage, but with one operating in its saturation region and one operating in its linear region, respectively. The summation of the two resulting outputs, if properly selected, can add one concave curve to one convex curve and generate a V-I curve that is close to linear. This is shown in FIG. 7, where N-channel transistors 71 and 72 are in saturation and N-channel transistor 73 is in the linear region. The sum current 74 (IREFGS) preferably maintains an approximately linear relationship with the control voltage 34. Current 74 is mirrored by P-channel transistors 75, 76 to control ring oscillator 40, which is represented in FIG. 7 as load 77.

Figure 8:
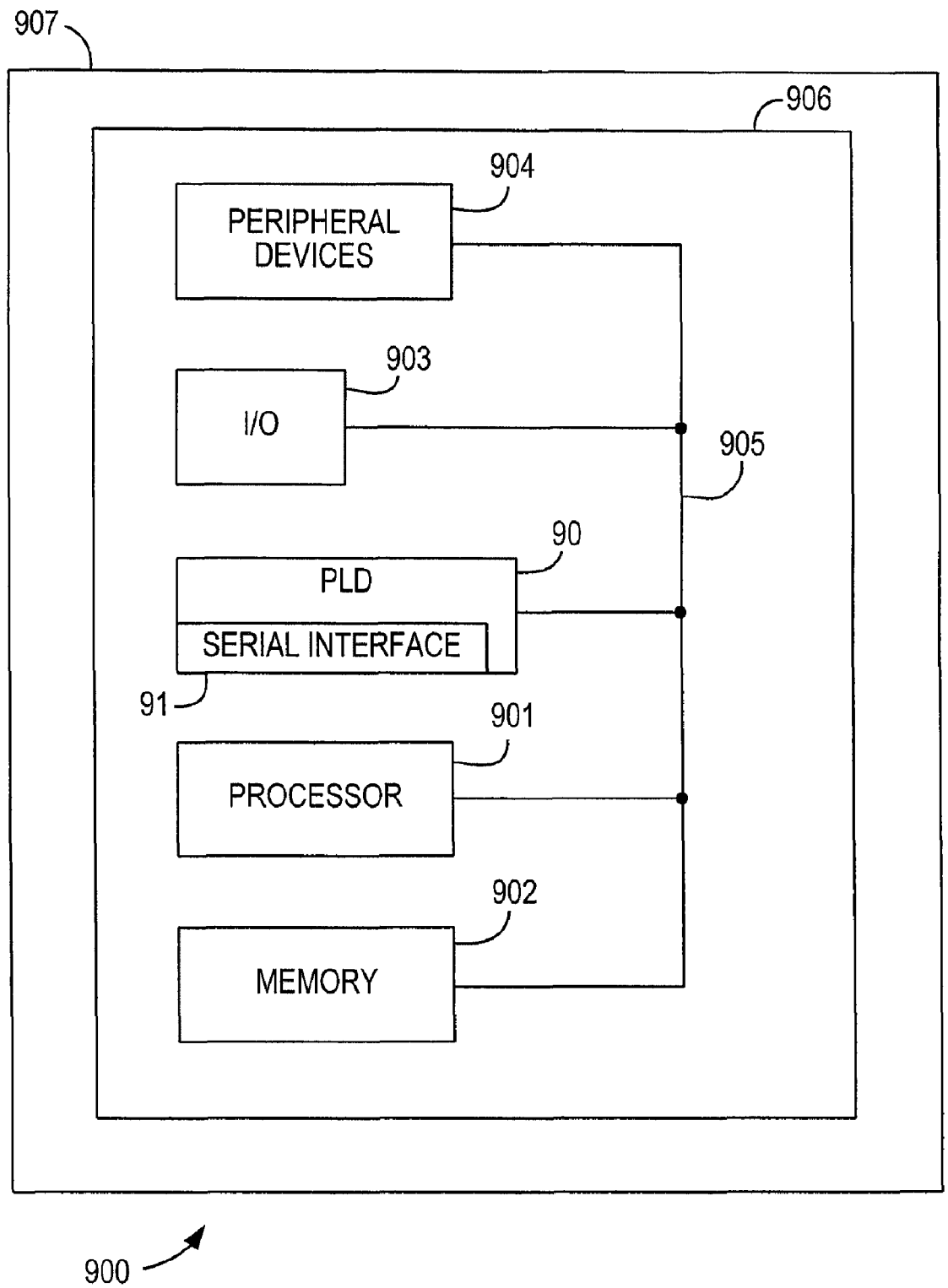
FIG. 8 is a simplified block diagram of an illustrative system employing a programmable logic device incorporating a serial interface using a VCO in accordance with the present invention.

Thus it is seen that a VCO with reduced gain, and therefore reduced sensitivity to control voltage variations, has been provided. A VCO in accordance with the present invention may be provided, as discussed above, in a serial interface 91 of a PLD 90 (see FIG. 8).

A PLD 90 incorporating the present invention may be used in many kinds of electronic devices. One possible use is in a data processing system 900 shown in FIG. 8. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A calibration method for use with an oscillator, said oscillator being part of a loop circuit and providing an output signal in a range of frequencies in response to an input signal based on an output of said loop circuit, said range of frequencies being divided into a plurality of subranges, said oscillator comprising a shift register having a plurality of locations corresponding to said plurality of subranges, each location of said shift register starting at a first end up to a position corresponding to said one of said subranges being loaded with a value indicating "select" and each location beyond said position corresponding to said one of said subranges being loaded with a value indicating "deselect"; wherein:
   said calibration method selects one of said subranges; and
   said calibration method comprises:
   initializing said oscillator in a default subrange;
   comparing said input signal to an upper threshold and when said input signal exceeds said upper threshold, adjusting said oscillator to a lower one of said subranges by shifting said value indicating "deselect" into said shift register;
   comparing said input signal to a lower threshold and when said input signal is less than said lower threshold, adjusting said oscillator to a higher one of said subranges by shifting said value indicating "select" into said shift register; and
   repeating said comparing to an upper threshold and adjusting, and repeating said comparing to a lower threshold and adjusting, until said input signal is at most equal to said upper threshold and at least equal to said lower threshold.

2. The method of claim 1 wherein:
   said oscillator comprises:
   a core oscillator stage including a current-controlled oscillator, and
   a coarse tuning stage including a current source for said current-controlled oscillator, said current source including a plurality of parallel, switchably selectable current legs;
   said plurality of locations of said shift register correspond to said plurality of switchably selectable current legs, wherein said value indicating "select" in any one of said locations causes a corresponding leg to be selected and said value indicating "deselect" in any one of said locations causes a corresponding leg to be deselected;
   said adjusting said oscillator to a higher one of said subranges by shifting said value indicating "select" into said shift register causes an additional one of said current legs to be selected, thereby selecting a higher frequency subrange; and said adjusting said oscillator to a lower one of said subranges by shifting said value indicating "deselect" into said shift register causes one of said current legs to be deselected, thereby selecting a lower frequency subrange.

3. Calibration circuitry for an oscillator of a loop circuit, said oscillator providing an output signal in a range of frequencies in response to an input signal, said range of frequencies being divided into a plurality of subranges, said oscillator including a coarse tuning stage that selects one of said subranges, and a core oscillator stage that, in response to varying of said input signal over an input range, causes said output signal to vary across said one of said subranges, said calibration circuitry comprising:

a first comparator that is operable to compare said input signal to an upper threshold, and is connected to a first shifting input of said coarse tuning stage; and a second comparator that is operable to compare said input signal to a lower threshold, and is connected to a second shifting input of said coarse tuning stage; and a shift register having a plurality of locations corresponding to said plurality of subranges, each location of said shift register starting at a first end up to a position corresponding to said one of said subranges being loaded with a voltage value indicating "select" and each location beyond said position corresponding to said one of said subranges being loaded with a voltage value indicating "deselect"; wherein:

when said input signal exceeds said upper threshold, said first comparator generates a first comparator output that is input to said first shifting input, thereby shifting into said shift register said value indicating "deselect" and selecting a lower frequency subrange;

when said input signal is below said lower threshold, said second comparator generates a second comparator output that is input to said second shifting input, thereby shifting into said shift register said value indicating "select" and selecting a higher frequency subrange.

4. The calibration circuitry of claim 3 wherein:
said core oscillator stage comprises a current-controlled oscillator; and said coarse tuning stage comprises a current source for said current-controlled oscillator, said current source including said plurality of parallel, switchably selectable current legs.

5. The calibration circuitry of claim 4 wherein:
said input signal is a voltage signal; and
said oscillator further comprises a voltage-to-current converter.

6. The calibration circuitry of claim 5 wherein:
said plurality of locations of said shift register correspond to said plurality of switchably selectable current legs, wherein said value indicating "select" in any one of said locations causes a corresponding leg to be selected and said value indicating "deselect" in any one of said locations causes a corresponding leg to be deselected;

said first shifting input shifting one of said value indicating "deselect" into said shift register causes one of said current legs to be deselected, thereby selecting a lower frequency subrange; and said second shifting input shifting one of said value indicating "select" into said shift register causes an additional one of said current legs to be selected, thereby selecting a higher frequency subrange.

7. The calibration circuitry of claim 3 wherein:
said value indicating "select" represents a logical "1"; and
said value indicating "deselect" represents a logical "0".

8. The calibration circuitry of claim 3 wherein:
said shift register is connected at said first end to a first source of voltage representing said value indicating "select" and is connected at a second end to a second source of voltage representing said value indicating "deselect".

9. The method of claim 1 wherein:
said value indicating "select" represents a logical "1"; and
said value indicating "deselect" represents a logical "0".

10. The method of claim 1 wherein:
said shift register is connected at said first end to a first source of voltage representing said value indicating "select" and is connected at a second end to a second source of voltage representing said value indicating "deselect".

* * * * *